United States Patent
Wang

(10) Patent No.: US 8,471,751 B2
(45) Date of Patent: Jun. 25, 2013

(54) TWO-STAGE ANALOG-TO-DIGITAL CONVERTER USING SAR AND TDC

(75) Inventor: Zhenning Wang, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 13/174,689

(22) Filed: Jun. 30, 2011

(65) Prior Publication Data

US 2013/0002467 A1 Jan. 3, 2013

(51) Int. Cl.
*H03M 1/12* (2006.01)
(52) U.S. Cl.
USPC ............... 341/156; 327/91; 327/94; 327/307; 348/241; 348/243; 348/308; 348/533; 341/136
(58) Field of Classification Search
USPC .................. 341/130–155; 348/241, 294, 243, 348/308, 533; 327/94, 91, 307
See application file for complete search history.

(56) References Cited

U.S. PATENT DOCUMENTS

| | | | |
|---|---|---|---|
| 5,313,207 A * | 5/1994 | Kouno et al. | 341/156 |
| 5,412,385 A * | 5/1995 | Mangelsdorf | 341/120 |
| 6,124,818 A | 9/2000 | Thomas et al. | |
| 6,313,775 B1 * | 11/2001 | Lindfors et al. | 341/143 |
| 6,535,156 B1 * | 3/2003 | Wang et al. | 341/156 |
| 6,747,588 B1 | 6/2004 | Huang et al. | |
| 7,277,040 B2 * | 10/2007 | Mazhar | 341/155 |
| 7,292,169 B2 * | 11/2007 | Mori et al. | 341/139 |
| 7,352,310 B2 * | 4/2008 | Mori et al. | 341/139 |
| 7,924,189 B2 * | 4/2011 | Sayers | 341/139 |
| 8,040,264 B2 * | 10/2011 | Hummerston et al. | 341/118 |
| 2010/0066583 A1 | 3/2010 | Jeon et al. | |
| 2010/0109924 A1 | 5/2010 | Cho et al. | |
| 2011/0102219 A1 | 5/2011 | Jeong et al. | |

OTHER PUBLICATIONS

Maloberti, Franco, "Nyquist Rate Analog to Digital Converters", Data Converters, Chapter 4, pp. 141-208, published by Springer 2007.
Kester, "Which ADC Architecture is Right for Your Application?", Analog Dialogue 39-06, Jun. 2005, pp. 1-8.
Cao et al., "A 500 mW ADC-Based CMOS AFE With Digital Calibration for 10 Gb/s Serial Links Over KR-Backplane and Multimode Fiber", IEEE Journal of Solid-State Circuits, vol. 45, No. 6, Jun. 2010, pp. 1172-1185.
Varzaghani et al., "A 4.8 GS/s 5-bit ADC-Based Receiver With Embedded DFE for Signal Equalization", IEEE Journal of Solid-State Circuits, vol. 44, No. 3, Mar. 2009, pp. 901-915.
Alpman et al., A 1.1V 50mW 2.5GS/s 7b Time-Interleaved C-2C SAR ADC in 45 nm LP Digital CMOS, ISSCC 2009, Session 4, High Speed Data Converters, 4.2, 2009 IEEE International Solid-State Circuits Conference, pp. 76-78.
Park et al., "A Single-Slope 80MS/s ADC using Two-Step Time-to-Digital Conversion", downloaded on Jul. 23, 2010 at 22:12:38 UTC from IEEE Xplore, 2009 IEEE, pp. 1125-1128.
International Search Report and Written Opinion for PCT/US/2012/040511, mailed Feb. 14, 2013, 9 pages.

* cited by examiner

*Primary Examiner* — Lam T Mai
(74) *Attorney, Agent, or Firm* — Schwabe, Williamson & Wyatt, P.C.

(57) ABSTRACT

Various embodiments of this disclosure may describe a two-stage ADC circuit, and a time-interleaved system based on the two-stage ADC circuit. The two-stage ADC circuit may include a SAR converter for the first stage and a charge based TDC for the second stage. The two-stage ADC circuit may be used in high performance serial I/O applications. Other embodiments may be disclosed and claimed.

18 Claims, 6 Drawing Sheets

TWO-STAGE ANALOG-TO-DIGITAL CONVERTER USING SAR AND TDC

TECHNICAL FIELD

The present disclosure generally relates to the field of electronics, in particular, to two-stage analog-to-digital converters using successive approximation registers (SAR) and time-to-digital converters (TDC).

BACKGROUND

Unless otherwise indicated herein, the materials described in this section are not prior art to the claims in this application and are not admitted to be prior art by inclusion in this section.

Analog-to-digital converters (ADC) may be used in digital serial input/output (I/O) receivers of various backplanes and/or interconnects. Examples of such digital serial I/O backplane/interconnect may include those implemented in accordance with Peripheral Component Interconnect Express (PCIe), version 3.0, published by PCI Special Interest Group (PCI-SIG) in November 2010, or Universal Serial Bus (USB), version 3.0, published by USB Implementers Forum (USB-IF) in November 2008, etc.

Many conventional ADCs used today are not all digital I/O based ADCs. A type of ADC that may be commonly used is flash ADCs, e.g., flash converters. Flash ADCs may have the advantage of relatively fast conversion speed. However, flash ADCs may suffer from high power consumption due to relatively high input capacitance. As such, flash ADCs may not be suitable for low power and high performance applications. For example, for an I/O application that supports a bandwidth over 10 Gb/s, a flash ADC may consume around 500 mW of power.

A two-stage ADC may trade off reduced power consumption with increased conversion latency. As the name suggests, a two-stage ADC may include a first stage ADC and a second stage ADC. The first stage ADC may coarsely convert the input analog signal into a first digital output signal. A difference between the input analog signal and the first digital output signal may then be generated, which may be referred to as the "residual signal." The second stage ADC may take the residual signal and convert it into a second digital output signal. The first and the second digital output signals may then be combined to form a single digital output signal, in which the first digital output signal may correspond to the most significant bit(s) (MSB) portion of the combined digital output signal, and the second digital output may correspond to the least significant bit(s) (LSB) portion of the combined digital output signal.

In conventional two-stage ADC design, both the first and the second stage ADCs may be flash ADCs. Between the two stages, a digital-to-analog converter (DAC) may convert the first digital output signal back to an analog signal and a subtractor may subtract the initial input analog signal with this converted analog signal to produce the residual signal. Typically, a closed-loop op-amp may also be required as the core of the switched capacitor system and/or to amplify the residual signal before it can be provided to the second stage ADC. Accordingly, the speed and accuracy of the two-stage ADC may be based on the performance of the closed-loop op-amp and the DAC. However, high performance op-amps that meet the bandwidth, latency and power consumption requirements of high performance I/O applications may be difficult to design due to the low supply voltage and the inherent (intrinsic) gains of MOS transistors, in particular with feature length of 100mn or less.

BRIEF DESCRIPTION OF THE DRAWINGS

Embodiments of the present disclosure will be described by way of exemplary illustrations, but not limitations, shown in the accompanying drawings in which like references denote similar elements, and in which.

DETAILED DESCRIPTION OF ILLUSTRATIVE EMBODIMENTS

In the following detailed description, reference is made to the accompanying drawings which form a part hereof, and in which are shown by way of illustration embodiments in which the disclosure may be practiced. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

Various operations may be described as multiple discrete operations in turn, in a manner that may be helpful in understanding embodiments of the present disclosure; however, the order of description should not be construed to imply that these operations are order dependent.

For the purposes of the description, a phrase in the form "A/B" or in the form "A and/or B" means (A), (B), or (A and B). For the purposes of the description, a phrase in the form "at least one of A, B, and C" means (A), (B), (C), (A and B), (A and C), (B and C), or (A, B and C). For the purposes of the description, a phrase in the form "(A)B" means (B) or (AB) that is, A is an optional element.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The description may use various terms, such as "comparator," "capacitor," "switch," and "latch," etc., to describe various components used in various embodiments. It is understood that these components may be implemented in various ways and/or be replaced by components of similar functionality. For example, a "capacitor" may be implemented based on semiconductor processes, such as a CMOS capacitor, or metal-oxide-metal capacitor. And a "switch" may be implemented by one or more transistors. Further, these components may be integrated into a single Application Specific Integrated Circuit (ASIC), Field Programmable Gated Array (FPGA), etc. Therefore, the terms used throughout this disclosure are for purpose of illustration only, not to be construed as limitations.

Various embodiments of this disclosure may describe a two-stage ADC circuit, and a time-interleaved system based on the two-stage ADC circuit. The two-stage ADC circuit may include a SAR converter for the first stage and a charged based TDC for the second stage. The two-stage ADC circuit may be used in high performance serial I/O applications.

Figure 1:
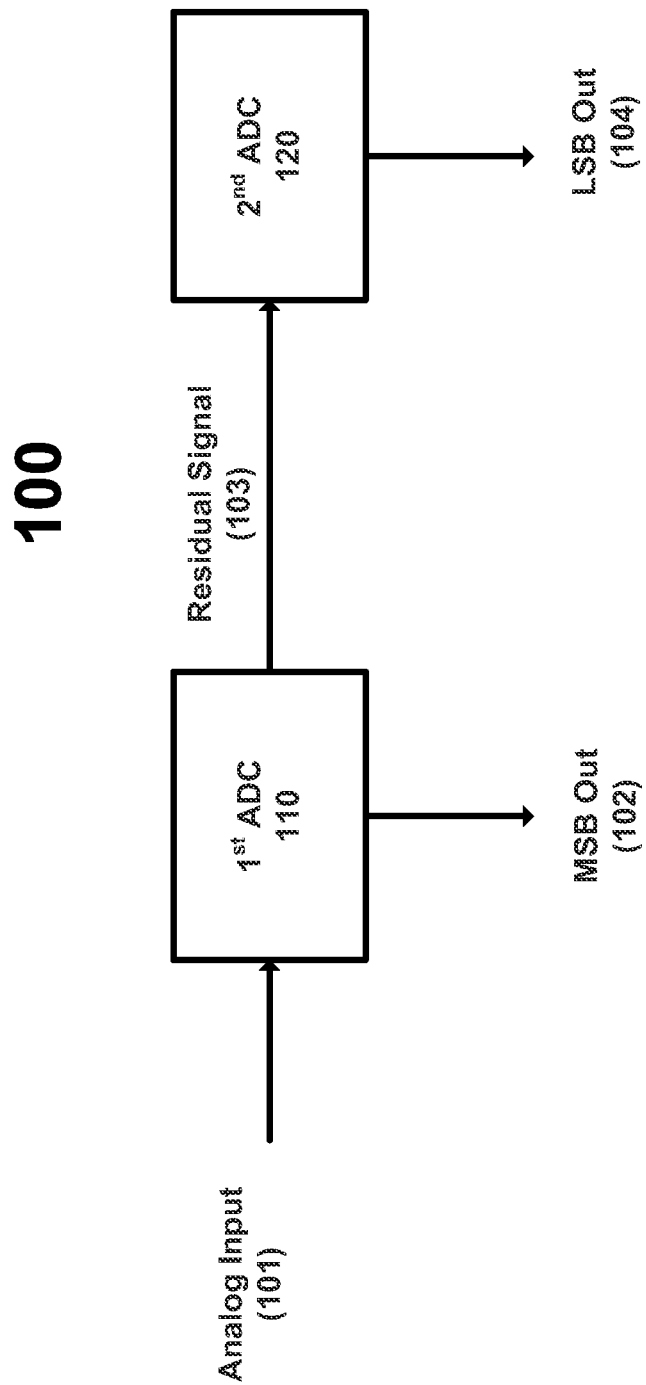
FIG. 1 is a block diagram illustrating an overview of a two-stage ADC circuit using SAR and TDC, in accordance with various embodiments of the present disclosure.

FIG. 1 is a block diagram illustrating a two-stage ADC circuit using SAR and TDC, in accordance with various embodiments of the present disclosure. In various embodiments, a two-stage ADC circuit 100 may include a first stage ADC 110 (endowed with a SAR) and a second stage ADC 120 (endowed with a TDC) coupled with each other. In various embodiments, the first stage ADC 110 may be configured to receive an analog input signal 101. The first stage ADC 110 may be configured to produce a first digital output 102 via a first analog-to-digital conversion of the analog input signal 101. For example, the first stage ADC 110 may be configured to coarsely convert the analog signal 101 into the first digital output 102. The first stage ADC 110 may also produce an analog residual signal 103. The residual signal 103 may correspond to a difference in value between the analog input signal 101 and the first digital output 102. In various embodiments, the second stage ADC 120 may be configured to produce a second digital output 104 based on the residual signal 103, via a second analog-to-digital conversion. In various embodiments, the first digital output 102 may include one or more bits, and the second digital output 104 may include one or more bits. In various embodiments, the first analog-to-digital conversion may be based on a SAR conversion process, while the second analog-to-digital conversion may be based on a TDC process, to be described more fully below.

Although not shown in FIG. 1, the first digital output 102 and the second digital output 104 may be combined to form a single digital output signal, using one or more bits of the first output 102 as the MSB portion of the digital output signal, and using one or more bits of the second output 104 as the LSB portion of the digital output signal, respectively. Accordingly, the first output 102 may correspond to the MSB portion of the digital output signal, and the second output 104 may correspond to the LSB portion of the digital output signal. In various embodiments, the first output 102 and/or the second output 104 may also receive one or more level of processing before they are combined. Such processing may include parity check, cyclic redundancy check (CRC), and other forms of digital error correction.

Although for ease of understanding, FIG. 1 illustrates the ADC 100 having two distinct components, i.e., 110 and 120, it is noted that these two components may be integrated into a single component, or further subdivided into more components.

Figure 2:
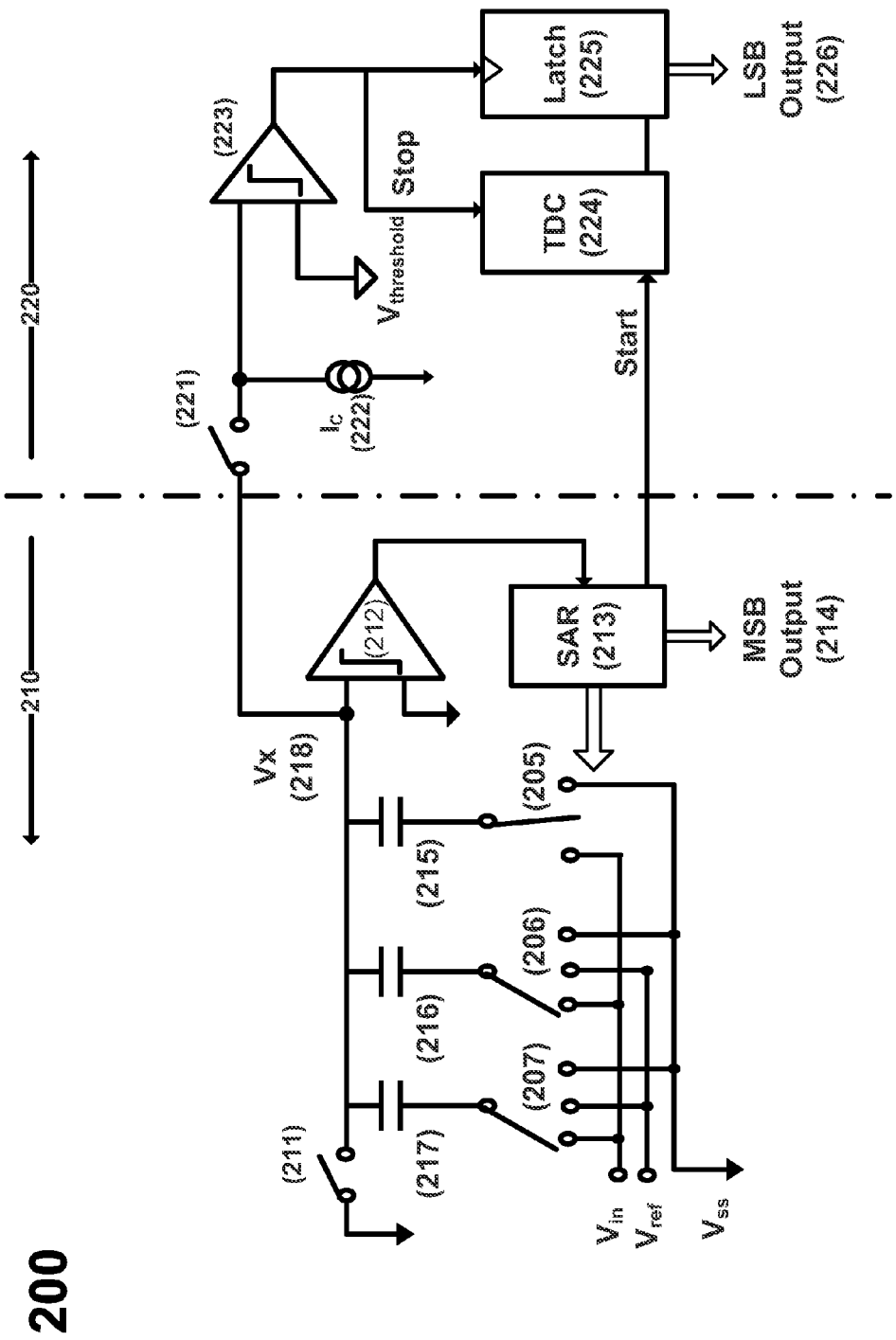
FIG. 2 is a more detailed block diagram illustrating the two-stage ADC circuit of FIG. 1 in further detail, in accordance with various embodiments of the present disclosure.

FIG. 2 is a block diagram illustrating the two-stage ADC circuit of FIG. 2 in more detail, in accordance with various embodiments of the present disclosure. As illustrated, two-stage ADC 200 may be divided into two areas, including a first stage ADC 210 and a second stage ADC 220. The first stage ADC 210 may include components located to the left of the dashed line in FIG. 2, and the second stage ADC 220 may include components located to the right of the dashed line. Although for ease of understanding, FIG. 2 illustrates the first stage ADC 210 and the second stage ADC 220 being divided at a particular location of the ADC 200, it is noted that such division is merely for purpose of illustration, and that the first stage ADC 210 and the second stage ADC 220 may be integrated into a single component, or divided into further components.

For the embodiments, the first stage ADC 210 may be configured to first convert an analog input voltage signal $V_{in}$ to a first output 214. In various embodiments, the first stage ADC 210 may include a sampling switch 211, a first comparator 212, a SAR logic 213, an array of capacitors 216 and 217, a corresponding array of switches 206 and 207. In various embodiments, the capacitors 216 and 217, the switches 211, 206 and 207, the comparator 212, and the SAR logic 213 may be coupled with each other, either directly or indirectly.

In various embodiments, as illustrated, the comparator 212 may be configured to compare a voltage $V_x$ at a node 218 with a ground signal $V_{ss}$. During the conversion process, the voltage $V_x$ at the node 218 may represent the instant voltage at the top side of the capacitors 216 and 217, which may be related to a reference voltage $V_{ref}$ and the analog input voltage signal $V_{in}$. The detailed relationship between $V_x$, $V_{ref}$, and $V_{in}$ will be disclosed in later sections of this disclosure.

Even though for ease of understanding, FIG. 2 illustrates the comparator 212 configured to compare the voltage $V_x$ with the ground signal $V_{ss}$ by receiving the voltage $V_x$ at its first input terminal and receiving the ground signal $V_{ss}$ at its second input terminal, in various embodiments, the comparator 212 may be configured to compare other voltage signals so long as the result of the comparison remain the same. For example, rather than comparing the $V_x$ with the ground signal $V_{ss}$, the comparator 212 may be configured to compare the input voltage $V_{in}$ with a voltage that is based on a function of $V_{ref}$ which may yield the same results as comparing $V_x$ with $V_{ss}$.

In various embodiments, the SAR 213 may be configured to receive the output of the comparator 212. The SAR 213 may be coupled to the switches 211, 206 and 207. During the analog-to-digital conversion, the SAR 213 may be configured to control the switches 211, 206, and 207 based on the output of the comparator 212 to redistribute the charges accumulated in the capacitors 216 and 217. After the conversion, the SAR 213 may also be configured to produce the first output 214 based on the statuses of the switches 206 and 207.

In various embodiments, the bottom side of the capacitors 216 and 217 may be respectively coupled with the array of switches 206 and 207, and the top side of the capacitors 216 and 217 may be coupled to the common node 218. Even though for east of understanding, FIG. 2 illustrates the capacitors 216 and 217 each having a top side and a bottom side, it is noted that terms such as "top side" and "bottom side" are merely used to illustrate relative positions of the capacitors in a circuit diagram, and therefore do not indicate any physical relationship between the components. Similarly, even though for ease of understanding, FIG. 2 depicts the various switches 211, and 205-207 with various open and/or closed positions, it is noted that these switches may be implemented by one or more transistors, and that the states of the switches 211, and 205-207, such as "open" or "closed," may be logically implemented based on various modes of the transistors. Furthermore, even though FIG. 2 depicts each one of the switches as a single switch, it is noted that the each one of the switches may include one or more other components, such as switches.

In various embodiments, the capacitor array may be binary weighted. For example, the capacitor 216 may have a capacitance of C, and the capacitor 217 may have a capacitance of 2C, in which C is a unit capacitance. The exact value of C may vary from case to case and may be adjusted based on the overall design and the application of the circuit 200. In various embodiments, C may be 50 fF. The number of capacitors in the capacitor array may correspond to the designed resolution of the first stage ADC 210. For example, as illustrated, the ADC 210 may have two capacitors 216 and 217 in the capacitor array to support a 2-bit digital output signal 214. Even though FIG. 2 illustrates two capacitors (i.e., capacitors 216 and 217), it is understood that the ADC 200 may include more or less capacitors to support a conversion resolution that is higher or lower than 2 bits.

In various embodiments, under the control of the SAR 213, the switches 206 and 207 may be configured to receive the analog input signal $V_{in}$, the reference signal $V_{ref}$, or the ground signal $V_{ss}$. In various embodiments, during the sampling phase of the operation of the ADC 210, the SAR 213 may flip the sampling switch 211 to its closed position, and cause the switches 206 and 207 to be coupled with the analog input voltage signal $V_{in}$. This may cause the bottom side of the capacitors 216 and 217 to be electrically charged. At the end of the sampling phase, the bottom side of the capacitors 216 and 217 may have a voltage of $V_{in}$. Consequently, the top side of the capacitors 216 and 217, i.e., the voltage $V_x$ at the node 218, may equal to $V_{in}$.

In various embodiments, at the end of the sampling phase of the ADC 210, the SAR 213 may flip the sampling switch 211 to its open position, and cause the switches 206 and 207 to be coupled to the ground signal $V_{ss}$. Subsequently, the SAR 213 may begin the conversion process by first flip the switch 207 to the reference signal $V_{ref}$, which may cause the voltage $V_x$ to be increased by $V_{ref}/2$. Thereafter, the comparator 212 may compare the voltage $V_x$ with the ground signal $V_{ss}$ and provide a result of the comparison to the SAR 213. If the result of the comparison indicates that the voltage $V_x$ may be lower than $V_{ss}$, the SAR 213 may keep the switch 207 at the reference signal $V_{ref}$. If the output of the comparator 212 indicates that the voltage $V_x$ may be higher than $V_{ss}$, the SAR 213 may flip the switch 207 back to $V_{ss}$, which may reduce the voltage $V_x$ back to $-V_{in}$. The SAR 213 may then proceed to the next channel of the conversion process by flipping the switch 206 to $V_{ref}$, which may further increase the voltage $V_x$ at node 218 by $V_{ref}/4$. The SAR 213 may then adjust the switch 206 based on the output of the comparator 212 in similar fashion. The conversion process may continue until all the channels in the array of capacitors are utilized.

In various embodiments, for a 2-bit SAR ADC, the first stage ADC 210 may complete the conversion phase in two clock cycles. In various embodiments, each clock cycle may be around 125 ps, and the total delay of the ADC 210 may be around 250 ps. In various embodiments, after the 2-bit SAR conversion, the voltage $V_x$ at the node 218 may be expressed as:

$$V_x = -V_{in} + \left(\frac{b_0}{2} + \frac{b_1}{2^2}\right) \cdot V_{ref}$$

in which $b_0$ and $b_1$ are the bit values of the first output 214, which may correspond to the states of the switches 207 and 206, respectively. Accordingly, $V_x$ may be determined based on the analog input signal $V_{in}$ and $V_{ref}$. In particular, $V_x$ may equal to the difference in value between the analog input signal $V_{in}$ and the first output 214. Therefore, at the end of the first conversion, the voltage at the node 218 $V_x$ may correspond to the residual signal 103 as illustrated in FIG. 1, which may be denoted as $V_{res}$.

In various embodiments, the accuracy of the residue voltage signal $V_{res}$ may be adjusted based on capacitor matching, which may be achievable by using known CMOS process without calibration for an ADC with a conversion resolution up to 8 bits. In various embodiments, an offset cancellation scheme may be used to eliminate the input offset of the first comparator 212, for example, by using a current trimming DAC.

In various embodiments, the first stage ADC 210 may also include a complementary capacitor 215, and a corresponding complementary switch 205. In various embodiments, the complementary capacitor 215 may have the same capacitance with the capacitor 216. In various embodiments, the complementary capacitor 215 may have a capacitance of C. The complementary switch 205 may be coupled to the SAR 213. In various embodiments, during the sampling phase, the SAR 213 may control the switch 205 to be coupled to the analog input voltage signal $V_{in}$. During the conversion phase, the switch 205 may stay coupled to the ground signal $V_{ss}$. Although the complementary switch 205 may not be adjusted similarly as the switches 206 and 207, the complementary capacitor 215 may help ensure that adjusting the switches 206 or 207 may cause an electrical charge corresponding to half of the remaining total capacitance of the ADC 210 to be redistributed in each channel of the conversion process. In various other embodiments, the complementary capacitor 215 may be optional.

In various embodiments, the second stage ADC 220 may perform a time-to-digital conversion of the residual signal $V_{res}$. In various embodiments, the second stage ADC 220 may include a switch 221, a current source 222, a second comparator 223, a TDC 224, and a latch 225 that are coupled with each other, directly or indirectly. In various embodiments, the latch 225 may be a DQ latch. In various embodiments, the TDC 224 and the latch 225 may be integrated into a single component.

In various embodiments, the switch 221 may be kept open during the SAR conversion of the first stage ADC 210. Upon generation of the residual voltage signal $V_{res}$, the switch 221 may be closed to allow the residual voltage signal $V_{res}$ to propagate to the rest of the second stage ADC 220. In various embodiments, the switch 221 may also be couple to the SAR 213 and operated under the control of the SAR 213.

In various embodiments, the ADC 220 may perform the time-to-digital conversion of the residual voltage signal $V_{res}$ by discharging the residual voltage signal $V_{res}$ via the current source 222, and simultaneously triggering the TDC 224 to produce a second output 226. In various embodiments, the ADC 220 may stop the time-to-digital conversion when the residual voltage signal $V_{res}$ reaches a threshold voltage $V_{threshold}$. The current source 222 may be configured to discharge the residual voltage signal $V_{res}$ at the node 218 at a near constant rate. Accordingly, the amount of time T needed to discharge the residue voltage signal $V_{res}$ to $V_{threshold}$ may be proportional to the residual voltage signal $V_{res}$. For example, T may be represented as:

$$T = \frac{(V_{res} - V_{thres}) \cdot C_{total}}{I_c}$$

in which $I_c$ is the value of the current source 222, and $C_{total}$ is the total capacitance of the first stage ADC 210, which may include the capacitance of the capacitors 215-217. In various embodiments, the second output generated by the TDC 224 may correspond to the value of T.

In various embodiments, the current source 222 may be designed to maintain satisfactory linearity in the operating region of the second stage ADC 220 by selecting a suitable value for the threshold voltage $V_{threshold}$. In various embodiments, $V_{threshold}$ may be selected based on various factors, including the range of $V_{res}$, and the respective designed resolutions of the first stage ADC 210 and the second stage ADC 220. For example, the ADC 200 may be an ADC with a total conversion resolution of 5-bits, which may include a first stage ADC with a 2-bit resolution and the second stage ADC with a 3-bit resolution. Accordingly, the residual voltage $V_{res}$ may be from 0 to $V_{ref}/4$, and the threshold voltage $V_{threshold}$ may be selected from 0 to $V_{ref}/32$. In various embodiments, the threshold voltage $V_{threshold}$ may be set to 0, or the ground signal $V_{ss}$.

In various embodiments, the ADC 220 may be configured to control the ending of the time-to-digital conversion process by using the second comparator 223. In various embodiments, the second comparator 223 may be an inverter based threshold detector. The second comparator 223 may receive the residual voltage signal $V_{res}$, and may be configured to compare the residual signal $V_{res}$ with the threshold voltage $V_{threshold}$. The second comparator 223 may provide the output of the second comparison to the TDC 224 and the latch 225. The TDC 224 may use the output of the second comparison as a control signal (e.g., "stop") to stop the time-to-digital conversion. Similarly, the latch 225 may use the output of the second comparison as a control signal to latch the second output 226. In various embodiments, as illustrated, the TDC 224 may also receive another control signal (e.g., "start") from the SAR 213.

Figure 3:
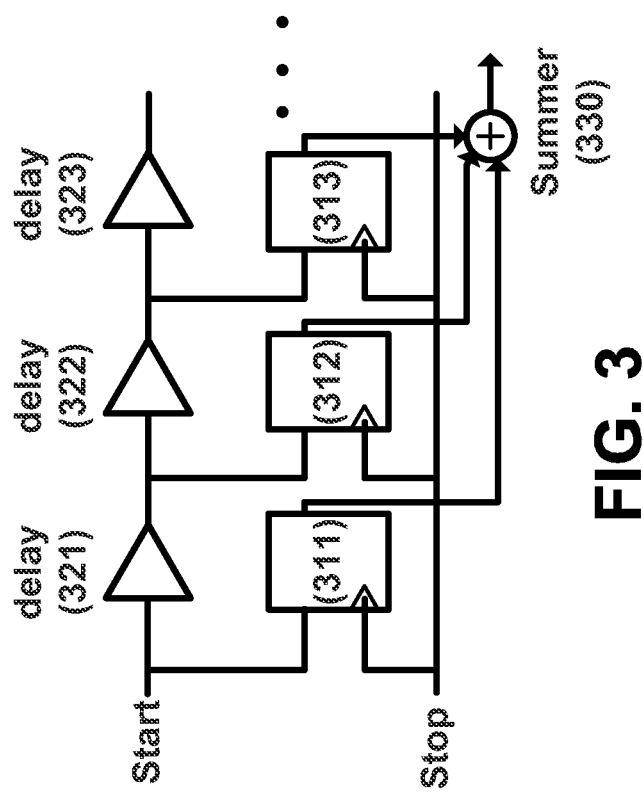
FIG. 3 is a block diagram illustrating more details of the TDC as illustrated in FIG. 2, in accordance with various embodiments of the present disclosure.

FIG. 3 is a block diagram illustrating more details of the TDC of FIG. 2, in accordance with various embodiments of the present disclosure. For the illustrated embodiments, the TDC 224 may include one or more latches 311-313, one or more delay elements 321-323, and a summer 330, that are coupled with each other, either directly or indirectly. The one or more latches may be DQ latches. In various embodiments, the TDC 224 may receive a "start" signal at the beginning of the time-to-digital conversion period. During the time-to-digital conversion, each delay element 321-323 may delay propagation of the start signal by a time segment $T_{delta}$. In various embodiments, the value of $T_{delta}$ may be around 5 ps. For each time segment $T_{delta}$, a corresponding one of the latches 311-313 may be triggered. At the end of the time-to-digital conversion, the TDC 224 may receive the stop signal that latches the output of latches 311-313. The output of the latches 311-313 may be added by the summer 330, and provided to the latch 225.

In various embodiments, the TDC 224 may include eight delay elements and eight latches to support a time-to-digital conversion of 3-bits (e.g. $2^3$). In other embodiments, the number of delay elements and latches included in the TDC 224 may be more or less than 8 to support a different resolution. Furthermore, in various embodiments, the TDC 224 may include more delay elements and more latches for purpose of digital error correction. For example, the TDC 224 may include enough delay elements and latches to generate a 5-bit output, which, after parity checking, may produce a 3-bit output.

In various embodiments, delay variations of the TDC 224 may be fixed during post processing by known techniques, including, for example, using a digital look-up table (LUT).

In various embodiments, as previously disclosed, by using a SAR based ADC as the first stage ADC 210, and a charge based TDC converter for the second stage ADC 220, the two-state ADC 200 may automatically generate the residual signal $V_{res}$ in an open loop fashion, avoiding inclusion of a complex closed-loop op-amp, which otherwise would be required in conventional two-stage ADC design. The number of comparators/threshold detectors used in the first and the second stage ADCs may also be greatly reduced compared to traditional two-stage ADCs based on flash converters (e.g., $2^M$ comparators for a two-stage ADC with M-bits resolution). By using a SAR based first stage ADC 210, input capacitance may also be reduced, which may lead to less power consumption.

Figure 4:
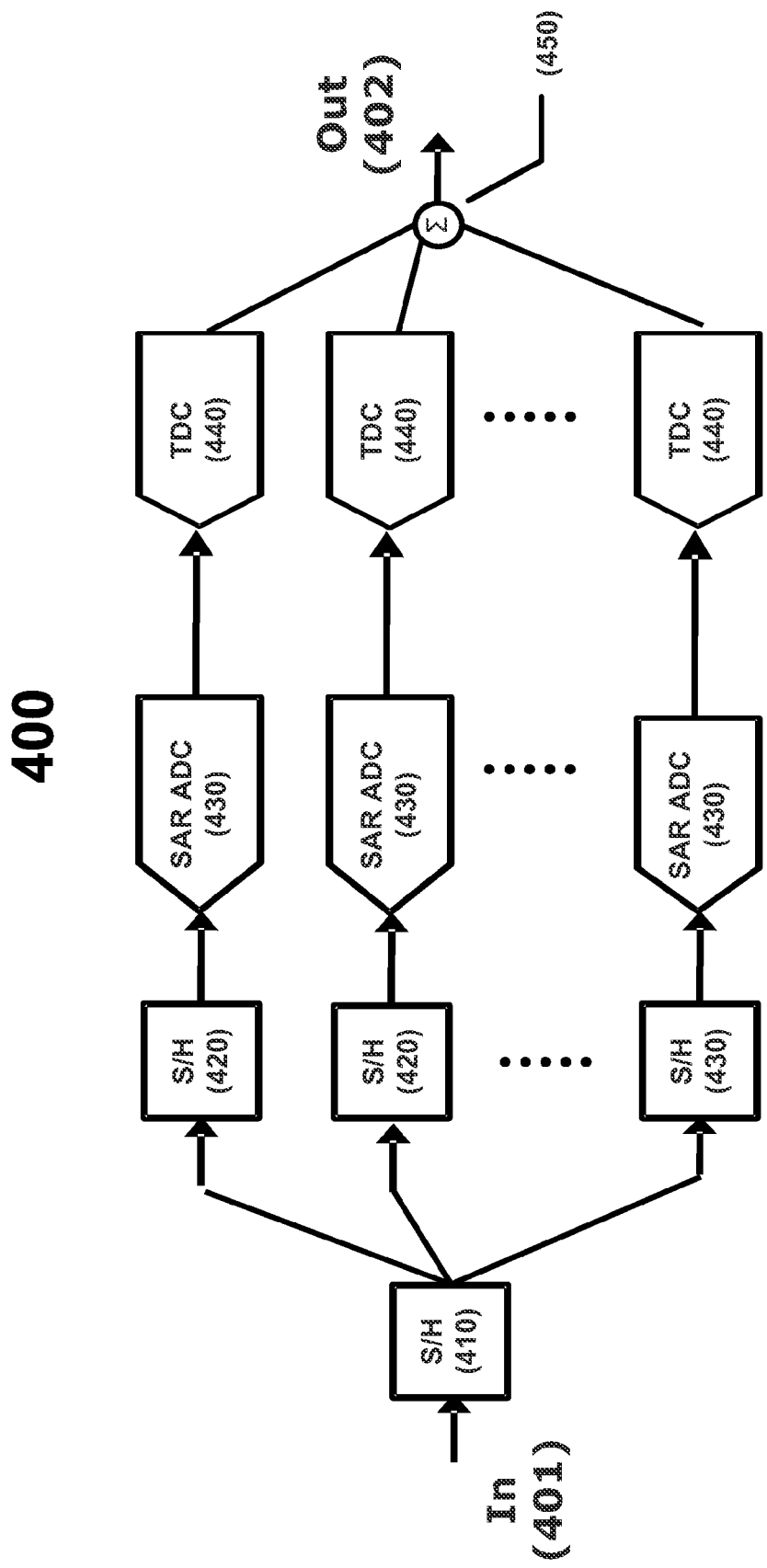
FIG. 4 is a block diagram illustrating a time interleaved ADC system, in accordance with various embodiments of the present disclosure.

FIG. 4 is a block diagram illustrating a time interleaved ADC system, in accordance with various embodiments of the present disclosure. A time interleaved ADC system 400 may be configured to receive an input analog signal 401 and generate a digital output signal 402. The ADC system 400 may include a master sample/hold switch 410, a summer 450, and a plurality of two-stage ADC circuits operate as a channel of the ADC system 400. Each two-stage ADC circuit may include a sample/hold switch 420, a first stage ADC 430, and a second stage ADC 440 as previously described. The output of the each of the plurality of two-stage ADC circuits may be combined by the summer 450. In various embodiments, sample/hold switch 410 and the sample/hold switches 420 may operate under different bandwidth/frequencies. For example, for a 4-way interleaved ADC system having a bandwidth of 10 Gb/s, the switch 410 may operate under 10 Gb/s, while the switches 420 may operate under 2.5 Gb/s.

In various embodiments, for a four-way time interleaving ADC system having a bandwidth of 10 Gb/s, such as previously described in the ADC system 400, with each channel having a 2-bit first conversion output and the a 3-bit second conversion output, simulation results may indicate that the total input capacitance may be around 800 fF and total power consumption may be at around 50 mW.

Figure 5:
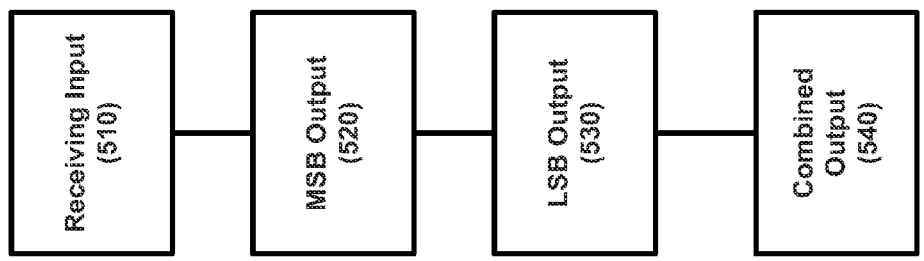
FIG. 5 is a flow diagram illustrating a portion of the operations of a two-stage ADC circuit, in accordance with various embodiments of the present disclosure.

FIG. 5 is a flow diagram illustrating a portion of the operations of a two-stage ADC circuit, in accordance with various embodiments of the present disclosure. In block 510, the two-stage ADC circuit 100 may receive an input analog signal 101. In block 520, the first stage ADC 110 may produce the first output 102 based on the input analog signal 101, and a residual signal 103. In block 530, the second stage ADC 120 may produce the second output 104 based on the residual signal 103. In block 540, the first output 102 and the second output 104 may be combined to form a single digital output.

Figure 6:
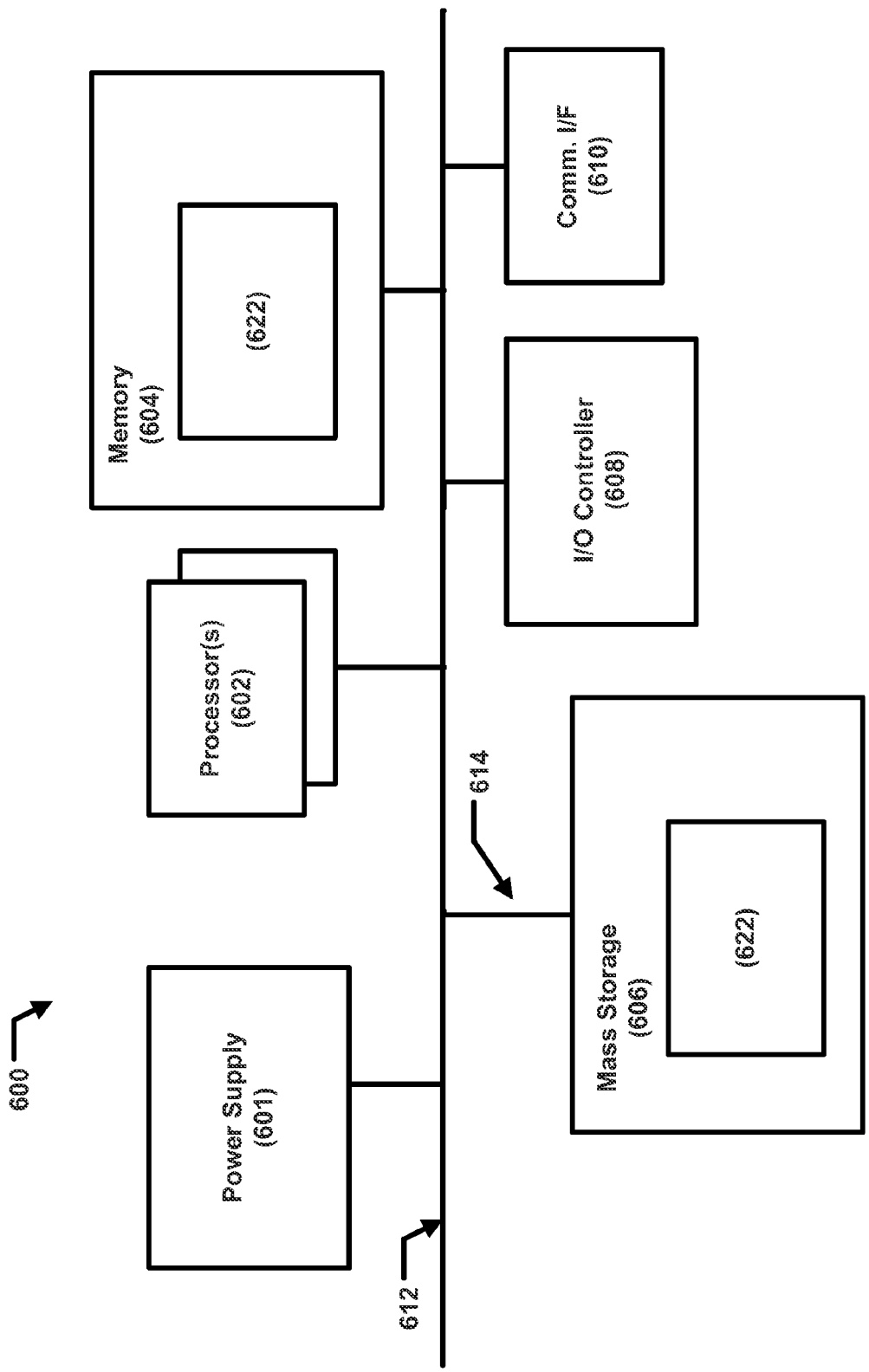
FIG. 6 is a block diagram illustrating an example computer system incorporated with various aspects of the described methods and/or apparatus, in accordance with embodiments of the present disclosure.

FIG. 6 illustrates an example computer system incorporated with various aspects of the earlier described methods and apparatuses, in accordance with embodiments of the present disclosure. As shown, a computer system 600 may include a power supply unit 601, a number of processors or processor cores 602, a number of tangible, non-transitory storage medium (such as, system memory 604, and mass storage 606), a communication interface 610, and an I/O controller 608. For the purpose of this application, including the claims, the terms "processor" and "processor cores" may be considered synonymous, unless the context clearly requires otherwise.

Additionally, the computing system 600 may include one or more tangible, non-transitory computer-readable mass storage devices 606 (such as diskette, hard drive, compact disc read only memory (CDROM) and so forth) that are based on standards such as PCIe, USB, etc. In various embodiments, the mass storage devices 606 may be coupled to a system bus 612 via an I/O interconnect 614. In various embodiments of the present disclosure, the I/O interconnect 614 may include one or more two-stage ADC circuits as previously described, and as illustrated in FIGS. 1-4. The system bus 612 may represent one or more buses. In the case of multiple buses, they may be bridged by one or more bus bridges (not shown). Data may pass through the I/O interconnect 614 to the system bus 612 from the I/O devices 608 to the processors 602.

The system memory 604 and the mass storage 606 may be employed to store a working copy and a permanent copy of the programming instructions implementing one or more operating systems, firmware modules or drivers, applications, and so forth, herein collectively denoted as 622. The permanent copy of the programming instructions may be placed into the permanent storage 606 in the factory, or in the field, through, for example, a distribution medium (not shown), such as a compact disc (CD), or through the communication interface 610 (from a distribution server (not shown)). That is, one or more distribution media having an implementation of the agent program may be employed to distribute the agent and program various computing devices.

The remaining constitution of these elements 601-622 are known, and accordingly will not be further described.

Although specific embodiments have been illustrated and described herein, it will be appreciated by those of ordinary skill in the art that a wide variety of alternate and/or equivalent implementations may be substituted for the specific embodiments shown and described, without departing from the scope of the embodiments of the present disclosure. This application is intended to cover any adaptations or variations of the embodiments discussed herein. Therefore, it is manifestly intended that the embodiments of the present disclosure be limited only by the claims and the equivalents thereof.

What is claimed is:

1. An apparatus, comprising:
a first analog-to-digital converter (ADC) configured to receive an analog input signal and to convert the analog input signal into a first digital signal, the first digital signal corresponding to a most-significant-bits (MSB) portion of a digital output signal,
wherein the first ADC comprises a successive approximation register (SAR) and is configured to produce a residual voltage corresponding to a difference in value between the analog input signal and the first digital signal; and
a second ADC coupled to the first ADC and configured to receive the residual voltage and to convert the residual voltage into a second digital signal, the second digital signal corresponding to a least-significant-bits (LSB) portion of the digital output signal,
wherein the second ADC comprises a time-to-digital converter (TDC), and
wherein the digital output signal is a digital representation of the analog input signal.

2. The apparatus of claim 1, wherein the first ADC includes an array of capacitors and an array of switches, wherein one side of respective ones of the array of capacitors are coupled to corresponding ones of the array of switches, and wherein an opposite side of the respective ones of the array of capacitors are coupled to a common node.

3. The apparatus of claim 1, wherein the residual voltage is based on a reference voltage.

4. The apparatus of claim 2, wherein the respective ones of the array of switches are configured to be coupled with the analog input signal, the reference voltage, or a ground voltage.

5. The apparatus of claim 1, wherein the second ADC further includes a comparator coupled with the TDC, and configured to compare the residual voltage with a threshold voltage to produce a control signal to output to the TDC to stop the second conversion.

6. The apparatus of claim 5, wherein the second ADC further includes a current source coupled to the comparator configured to drain the residual voltage at a near constant rate.

7. The apparatus of claim 1, wherein the first ADC and the second ADC are part of a first channel of an ADC circuit, wherein the ADC circuit further includes a second channel configured to operate with the first channel in a time-interleaved fashion, wherein the second channel includes a third ADC similarly configured as the first ADC and a fourth ADC similarly configured as the second ADC.

8. A method, comprising:
receiving, by a two-stage analog-to-digital converter (ADC), an analog input signal;
first converting, by a first stage of the ADC, the analog input signal into a first digital signal corresponding to a most-significant-bits (MSB) portion of a digital output signal via a successive approximation conversion process;
generating, by the first stage of the ADC, a residual voltage corresponding to a difference in value between the analog input signal and the first digital signal; and
second converting, by a second stage of the ADC, the residual voltage into a second digital signal corresponding to a least-significant-bits (LSB) portion of the digital output signal via a time-to-digital conversion process, wherein the second converting includes discharging the residual voltage in a near constant rate by a current source of the ADC;
wherein the digital output signal is a digital representation of the analog input signal.

9. The method of claim 8, further comprising combining the first digital signal and the second digital signal to form the digital output signal.

10. The method of claim 8, wherein said second converting includes stopping said discharging upon determining that the residual voltage has reached a threshold voltage level.

11. The method of claim 8, wherein said first converting includes controlling one or more of a plurality of switches to be coupled with the analog input signal, a reference voltage, or a ground voltage.

12. A method comprising:
receiving, by a two-stage analog-to-digital converter (ADC), an analog input signal;
first converting, by a first stage of the ADC, the analog input signal into a first digital signal corresponding to a most-significant-bits (MSB) portion of a digital output signal via a successive approximation conversion process;
generating, by the first stage of the ADC, a residual voltage corresponding to a difference in value between the analog input signal and the first digital signal; and
second converting, by a second stage of the ADC, the residual voltage into a second digital signal corresponding to a least-significant-bits (LSB) portion of the digital output signal via a time-to-digital conversion process,
wherein the digital output signal is a digital representation of the analog input signal, and
wherein the second digital signal includes one or more bits for error correction.

13. A system, comprising:
a tangible and non-transitory mass storage device; and
an input/output (I/O) interconnect coupled to the mass storage device and configured to transfer data to and from the mass storage device, the I/O interconnect includes:
a first analog-to-digital converter (ADC) configured to receive an analog input signal and to first convert the analog input signal into a first digital signal, the first digital signal corresponding to a most-significant-bits (MSB) portion of a digital output signal, wherein the first ADC comprises a successive approximation register (SAR) and is configured to produce a residual voltage corresponding to a difference in value between the analog input signal and the first digital signal; and a second ADC coupled to the first ADC and configured to receive the residual voltage and to second convert the residual voltage into a second digital signal, the second digital signal corresponding to a least-significant-bits (LSB) portion of the digital output signal, wherein the digital output signal is a digital representation of the analog input signal, and wherein the first ADC and the second ADC are part of a first channel of an ADC circuit, wherein the ADC circuit further includes a second channel configured to operate with the first channel in a time-interleaved fashion, wherein the second channel includes a third ADC similarly configured as the first ADC and a fourth ADC similarly configured as the second ADC.

14. The system of claim 13, wherein the first ADC includes an array of capacitors and an array of switches, wherein one side of respective ones of the array of capacitors are coupled to corresponding ones of the array of switches, and wherein an opposite side of the respective ones of the array of capacitors are coupled to a common node.

15. The system of claim 13, wherein the residual voltage is based on a reference voltage.

16. The system of claim 14, wherein the respective ones of the array of switches are configured to be coupled with the analog input signal, the reference voltage, or a ground signal.

17. The system of claim 13, wherein the second ADC comprises a time-to-digital converter (TDC), and wherein the second ADC further includes a comparator coupled with the TDC, and configured to compare the residual voltage with a threshold voltage to produce a control signal to output to the TDC to stop the second conversion.

18. The system of claim 17, wherein the second ADC further includes a current source coupled to the comparator configured to drain the residual voltage at a near constant rate.

* * * * *